US010289168B2

(12) United States Patent
Sarraf et al.

(10) Patent No.: US 10,289,168 B2
(45) Date of Patent: May 14, 2019

(54) COMPONENT PLACEMENT WITHIN A SOLID STATE DRIVE

(71) Applicant: Western Digital Technologies, Inc., San Jose, CA (US)

(72) Inventors: Mohammad Sarraf, Trabuco Canyon, CA (US); Billy Hung Vu, Lake Forest, CA (US); John P. Myers, Lake Forest, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/669,685

(22) Filed: Aug. 4, 2017

(65) Prior Publication Data
US 2017/0329372 A1    Nov. 16, 2017

Related U.S. Application Data

(62) Division of application No. 14/089,991, filed on Nov. 26, 2013, now Pat. No. 9,740,248.

(60) Provisional application No. 61/832,707, filed on Jun. 7, 2013.

(51) Int. Cl.
| | |
|---|---|
| *G11C 5/04* | (2006.01) |
| *G06F 1/18* | (2006.01) |
| *H05K 1/11* | (2006.01) |
| *H05K 1/14* | (2006.01) |
| *H01R 12/71* | (2011.01) |

(52) U.S. Cl.
CPC .............. *G06F 1/183* (2013.01); *G06F 1/186* (2013.01); *G11C 5/04* (2013.01); *H01R 12/716* (2013.01); *H05K 1/111* (2013.01); *H05K 1/118* (2013.01); *H05K 1/147* (2013.01)

(58) Field of Classification Search
CPC ........ H05K 1/11–1/148; H01R 12/716–12/75; H01R 12/79; H01R 12/732
See application file for complete search history.

(56) References Cited

U.S. PATENT DOCUMENTS

| 3,601,774 A | 8/1971 | Stathos et al. |
| 5,846,094 A | 12/1998 | Murray et al. |
| 6,856,556 B1 | 2/2005 | Hajeck |
| (Continued) |

FOREIGN PATENT DOCUMENTS

| CN | 101833987 A | 9/2010 |
| CN | 102498562 A | 6/2012 |
| (Continued) |

OTHER PUBLICATIONS

Chinese Office Action (with attached English translation) for Application No. 20140038657.5; dated Feb. 23, 2017; 16 total pages.

(Continued)

*Primary Examiner* — Ramon M Barrera
(74) *Attorney, Agent, or Firm* — Patterson & Sheridan, LLP; Steven Versteeg (57) ABSTRACT

A component mount for a data storage device (DSD). The component mount includes a flexible member or printed circuit board assembly (PCBA) including a pad for electrically connecting to a printed circuit board (PCB) of the DSD. At least one capacitor is mounted on the flexible member or PCBA, and is electrically connected with the pad.

18 Claims, 14 Drawing Sheets

(56) References Cited

U.S. PATENT DOCUMENTS

| | | | |
|---|---|---|---|
| 6,932,649 B1 * | 8/2005 | Rothermel | H01R 13/6658 439/620.01 |
| 7,126,857 B2 | 10/2006 | Hajeck | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,166,245 B2 | 4/2012 | Diggs et al. | |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 8,713,066 B1 | 4/2014 | Lo et al. | |
| 8,713,357 B1 | 4/2014 | Jean et al. | |
| 8,719,531 B2 | 5/2014 | Strange et al. | |
| 8,724,422 B1 | 5/2014 | Agness et al. | |
| 8,725,931 B1 | 5/2014 | Kang | |
| 8,745,277 B2 | 6/2014 | Kan | |
| 8,751,728 B1 | 6/2014 | Syu et al. | |
| 8,769,190 B1 | 7/2014 | Syu et al. | |
| 8,769,232 B2 | 7/2014 | Suryabudi et al. | |
| 8,775,720 B1 | 7/2014 | Meyer et al. | |
| 8,782,327 B1 | 7/2014 | Kang et al. | |
| 8,788,778 B1 | 7/2014 | Boyle | |
| 8,788,779 B1 | 7/2014 | Horn | |
| 8,788,880 B1 | 7/2014 | Gosla et al. | |
| 8,793,429 B1 | 7/2014 | Call et al. | |
| 2010/0073860 A1 | 3/2010 | Moriai et al. | |
| 2010/0174849 A1 | 7/2010 | Walston et al. | |
| 2010/0190357 A1 | 7/2010 | Hashim | |
| 2010/0250793 A1 | 9/2010 | Syu | |
| 2011/0019370 A1 | 1/2011 | Koh | |
| 2011/0063790 A1 | 3/2011 | Park et al. | |
| 2011/0099323 A1 | 4/2011 | Syu | |
| 2011/0211310 A1 | 9/2011 | Farling et al. | |
| 2011/0229709 A1 | 9/2011 | Kuszaj | |
| 2011/0283049 A1 | 11/2011 | Kang et al. | |
| 2012/0063108 A1 | 3/2012 | Kim et al. | |
| 2012/0139483 A1 * | 6/2012 | Cottet | H01G 2/06 320/107 |
| 2012/0260020 A1 | 10/2012 | Suryabudi et al. | |
| 2012/0278531 A1 | 11/2012 | Horn | |
| 2012/0280867 A1 | 11/2012 | Baek et al. | |
| 2012/0284460 A1 | 11/2012 | Guda | |
| 2012/0324191 A1 | 12/2012 | Strange et al. | |
| 2013/0132638 A1 | 5/2013 | Horn et al. | |
| 2013/0145106 A1 | 6/2013 | Kan | |
| 2013/0188306 A1 | 7/2013 | Park et al. | |
| 2013/0290793 A1 | 10/2013 | Booth et al. | |
| 2014/0059405 A1 | 2/2014 | Syu et al. | |
| 2014/0101369 A1 | 4/2014 | Tomlin et al. | |
| 2014/0115427 A1 | 4/2014 | Lu | |
| 2014/0133220 A1 | 5/2014 | Danilak et al. | |
| 2014/0136753 A1 | 5/2014 | Tomlin et al. | |
| 2014/0149826 A1 | 5/2014 | Lu et al. | |
| 2014/0157078 A1 | 6/2014 | Danilak et al. | |
| 2014/0181432 A1 | 6/2014 | Horn | |
| 2014/0223255 A1 | 8/2014 | Lu et al. | |

FOREIGN PATENT DOCUMENTS

| | | |
|---|---|---|
| KR | 10-0714648 B1 | 5/2007 |
| KR | 10-2008-0071447 A | 8/2008 |
| KR | 10-2010-0101958 A | 9/2010 |

OTHER PUBLICATIONS

International Search Report and Written Opinion dated Oct. 7, 2014 from related PCT Serial No: PCT/US2014/041432, 12 pages.

Extended Search Report from counterpart European Application No. 14807242.4, dated Dec. 14, 2016, 59 pages.

* cited by examiner

COMPONENT PLACEMENT WITHIN A SOLID STATE DRIVE

CROSS-REFERENCE TO RELATED APPLICATION(S)

This application is a divisional application of U.S. patent application Ser. No. 14/089,991, filed Nov. 26, 2013, which application claims the benefit of U.S. Provisional Application No. 61/832,707, filed on Jun. 7, 2013, both of which are hereby incorporated by reference in its entirety.

BACKGROUND

Solid state drives (SSD) require a backup power source to ensure that data can be safely written to cache and the SSD gracefully shuts down when the main power source becomes unavailable. SSDs often utilize a capacitor farm to provide backup power. Thus, a series of capacitors are often arranged on the same printed circuit board (PCB) as the flash memory. However, the capacitors required to provide sufficient backup power may occupy more space than is available on the PCB or may be taller than the other components and therefore require the PCB to be placed deeper within the drive enclosure to ensure the capacitors do not extend beyond the enclosure. This reduces the vertical space available on the side of the PCB opposite the capacitors.

Larger SSD enclosures, such as those having a 15 mm z-height, may not be impacted by the heights of the capacitors, which may be 4 mm. However, in smaller device sizes, such as 7 mm z-height, the heights of the capacitors occupy a larger portion of the available z-height. Replacing the tall capacitors with an increased number of shorter capacitors presents challenges to layout design. In addition, PCBs commonly used in SSDs cannot support capacitors mounted on both sides.

BRIEF DESCRIPTIONS OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various implementations disclosed may be practiced without some of these specific details. In other instances, well-known structures and techniques have not been shown in detail to avoid unnecessarily obscuring the various implementations.

Figure 1A:
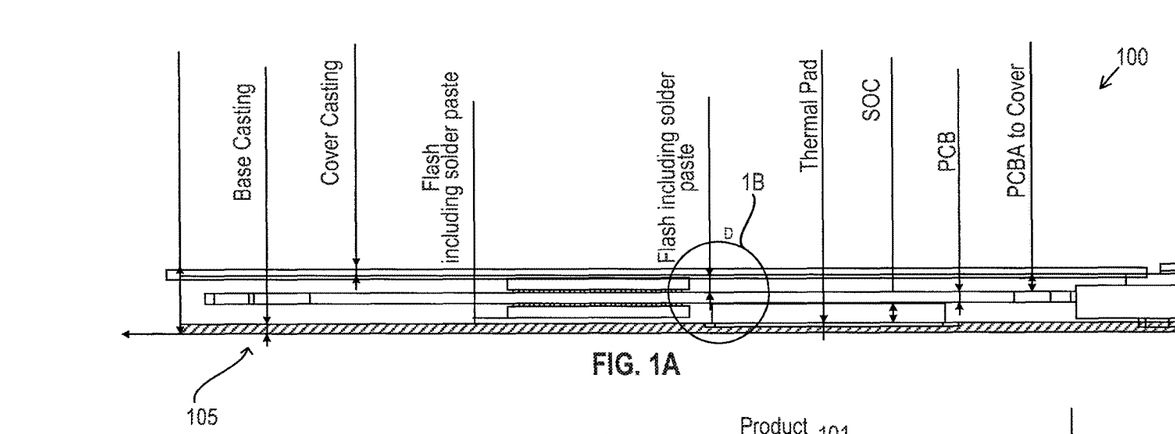
FIG. 1A depicts a side view of an SSD case and components according to one implementation of the present disclosure.
Figure 1B:
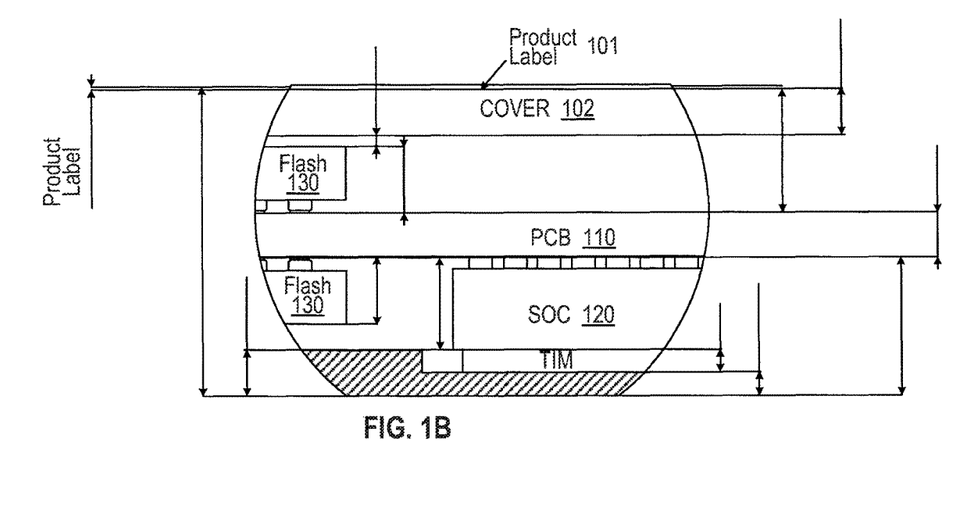
FIG. 1B depicts a close up view of FIG. 1A.

Although the present disclosure discusses SSDs having a 7 mm profile, in other implementations other device profiles may be used, such as 15 mm. In addition, the concepts described below may be applied to any data storage device (DSD), such as hard disk drives (HDD) and solid state hybrid drives (SSHD). FIG. 1A presents an example SSD 100 having a 7 mm profile. The entire package, including the covers, has a height of 7 mm. However, due to the thicknesses of parts, less than 7 mm of z-height are available within the SSD case. For example, an area 105 of the SSD 100 may be where capacitors are generally mounted. Due to components, such as a PCB 110 (see FIG. 1B), the full z-height is not available for capacitors. In addition, the PCB 110 is suspended, such that the available z-height is separated into two smaller z-heights. FIG. 1B shows a close up of the z-heights near the flash memory 130. In other examples, the z-height of the SSD 100 may be different (e.g., 5 mm).

FIG. 1B presents an exemplary SSD layout, which will be discussed with respect to a 7 mm profile. In other implementations other device profiles and components with different z-heights may be used. In FIG. 1B, a product label 101 has a thickness of about 0.074 mm, a cover 102 has a thickness of about 1 mm, and a base casting 103 also has a thickness of about 1 mm near the flash memory 130. The PCB 110, on which the flash memory 130 and a system-on-chip (SOC) 120 are mounted, has a thickness of about 1 mm. Thus, only about 2 mm above the PCB 110 and only about 2 mm below the PCB 110 are available. In other words, components mounted on either side of the PCB 110, such as near the area 105, must be less than 2 mm in height in order to fit. Also in FIG. 1B, a thermal interface material (TIM) may have a z-height, which is accounted for by having a thinner base. Other materials, such as a shock absorbing layer on the base, may further restrict or limit available z-height.

In this exemplary configuration, approximately 0.325 J of energy may be required to provide adequate backup power. Other implementations may require different energy amounts. Backup capacitors can store the required energy. As seen in FIG. 1A, components are mounted on the PCB 110. In this configuration, components, such as backup capacitors, having a z-height greater than 2 mm cannot be easily mounted onto the PCB 110. Large capacitors are about 3 mm in z-height, whereas most other internal components in an SSD average 1 to 1.5 mm in z-height. In other words, the placement of the PCB 110 is generally dictated by the z-height of the capacitors.

Figure 2A:
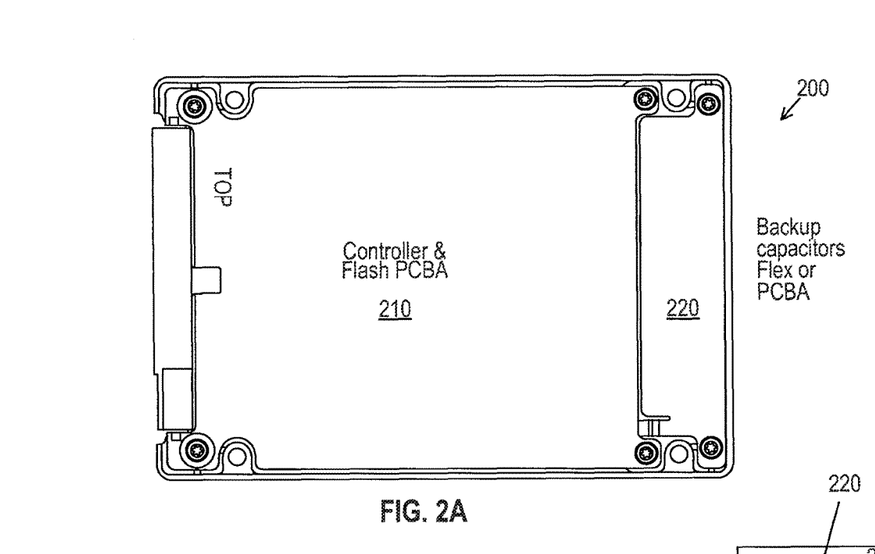
FIG. 2A depicts a printed circuit board (PCB) layout according to one implementation of the present disclosure.

FIG. 2A presents a layout using a component mount according to one implementation. The controller, such as the SOC 120, and the flash memory, such as the flash memory 130, are mounted on a PCB 210. Backup capacitors and/or other components are mounted on a component mount 220 in order to avoid the z-height restrictions when mounting components on the PCB 210, as the component mount 220 may be mounted at a different z-height than the PCB 210. This provides additional design freedom. The component mount 220 may comprise a flexible member (flexure or flex), which may be 0.1-0.2 mm thick to free up addition z-height, or a printed circuit board assembly (PCBA), which may be thinner than the PCB 210. The components may be mounted on one or both sides of the flex or PCBA, as will be discussed below. This z-height optimization also achieves higher energy density by allowing larger capacity capacitors to be mounted using the minimum amount of space on the flex or PCBA.

Figure 2B:
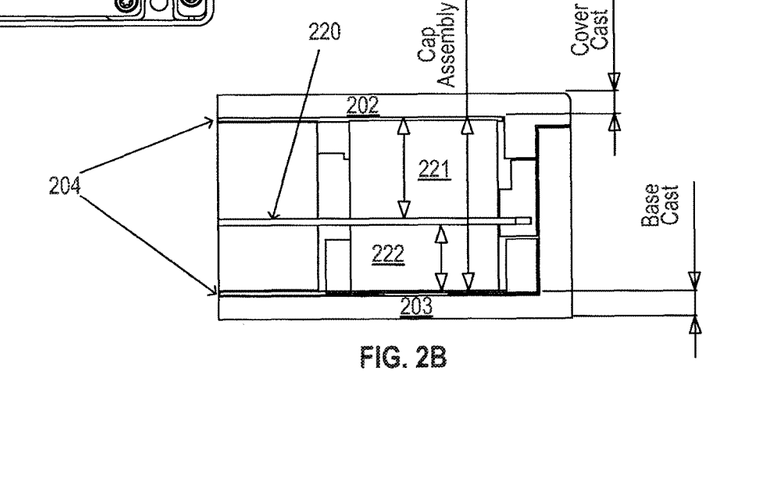
FIG. 2B depicts a profile view of FIG. 2A.

FIG. 2B illustrates the additional z-height available through the use of the component mount 220, rather than mounting all the components on the PCB. For example, the flex may have a thickness of about 0.2 mm, and a cover 202 and a base 203 may each have about 0.7 mm thickness, leaving around 5.4 mm of z-height in a 7 mm profile SSD. In contrast to FIG. 1B, where 2 mm was a maximum height of components, in FIG. 2B, taller components may be mounted. A capacitor 221 can have a z-height of 3 mm, and a capacitor 222 can have a z-height of 2 mm, leaving about 0.4 mm of clearance (i.e., 0.2 mm of clearance for each of capacitors 221 and 222). As seen in FIG. 2B, the flex need not be generally centered with respect to z-height. Also seen in FIG. 2B, a shock isolator or shock absorbing layer 204 may be disposed on the cover 202 and the base 203. The shock absorbing layer 204 may be made of a shock absorbing material, which may be affixed to the cover 202 and base 203 with an adhesive backing. When the SSD 200 is assembled, the shock absorbing layers 204 may squeeze the components within the SSD 200 together, to better absorb shock and to prevent the components from vibrating.

Figure 3A:
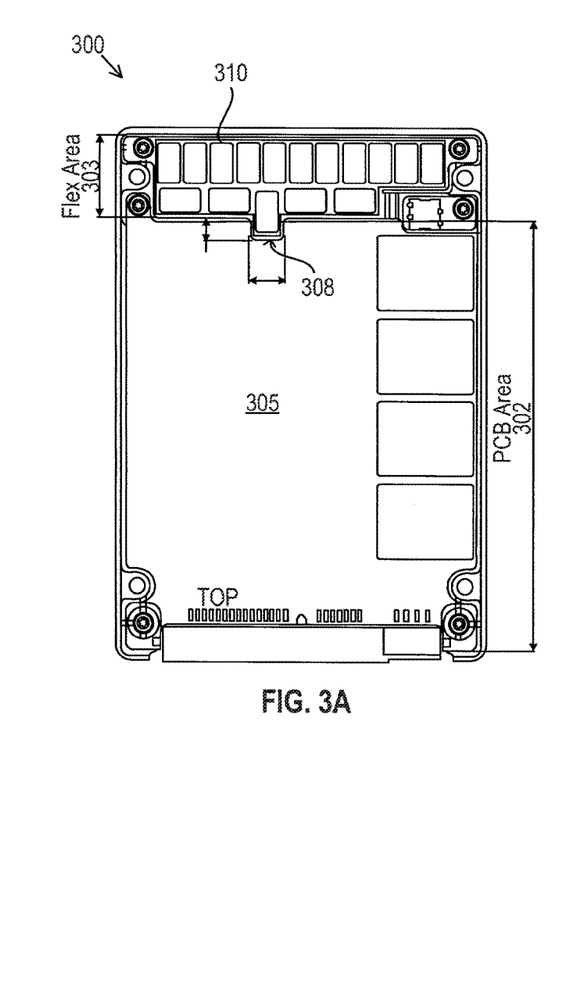
FIG. 3A depicts a component mount layout according to one implementation of the present disclosure.

FIG. 3A depicts an SSD 300 having one implementation of a component mount 310. A PCB 305 occupies a first portion 302 of an area within the SSD 300. The PCB 305 includes a notch 308. The placement of the notch 308 may allow room for additional capacitors. The component mount 310 occupies a second portion 303 of the area. Because the component mount 310 and the PCB 305 do not generally overlap, there is greater flexibility in adjusting the z-height of the component mount 310 without needing to adjust the z-height of the PCB 305.

Figure 3B:
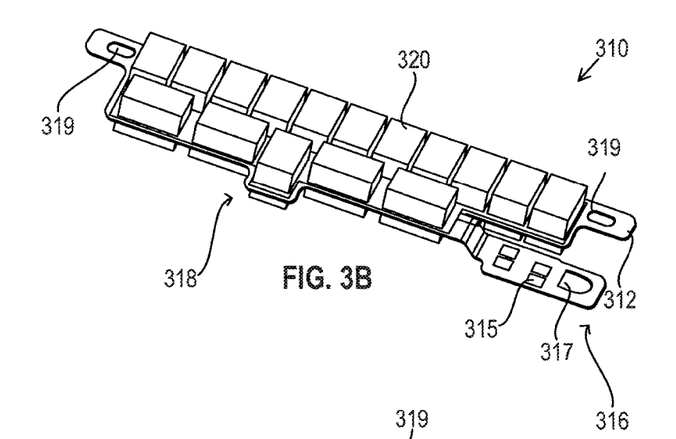
FIG. 3B depicts the component mount of FIG. 3A according to one implementation of the present disclosure.
Figure 3C:
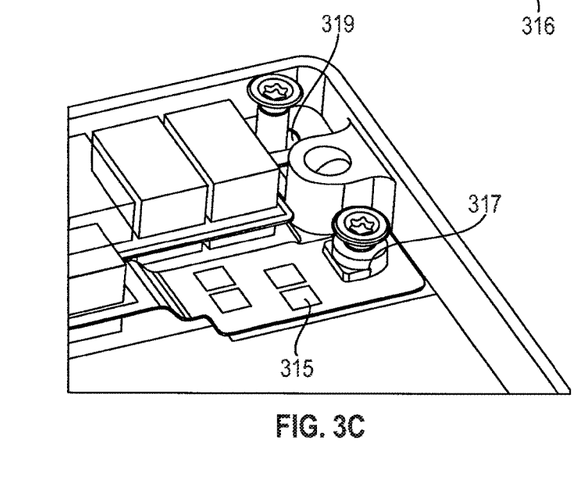
FIG. 3C depicts a close up view of a portion of the layout in FIG. 3A.

As seen in FIG. 3B, the component mount 310 comprises a main portion 312 having a plurality of capacitors 320 mounted on both sides. The main portion 312 may be a flex or a PCB, and includes one or more holes 319 for mounting with screws, as seen in FIG. 3C. The main portion 312 includes an alignment feature 317 to help align the component mount 310 when mounting onto the SSD 300. As seen in FIG. 3C, the alignment feature 317 is a hole with two squared corners that aligns the component mount 310 when dropped over a similarly shaped screw mount in a base casting. In other implementations the alignment feature 317 may have alternative shapes having a distinguishable orientation in order to align the component mount 310. The main portion 312 further includes pads 315 for ground and power connections as well as other electrical connections for the capacitors 320 and may comprise a shaped layer of conductive material.

Figure 3D:
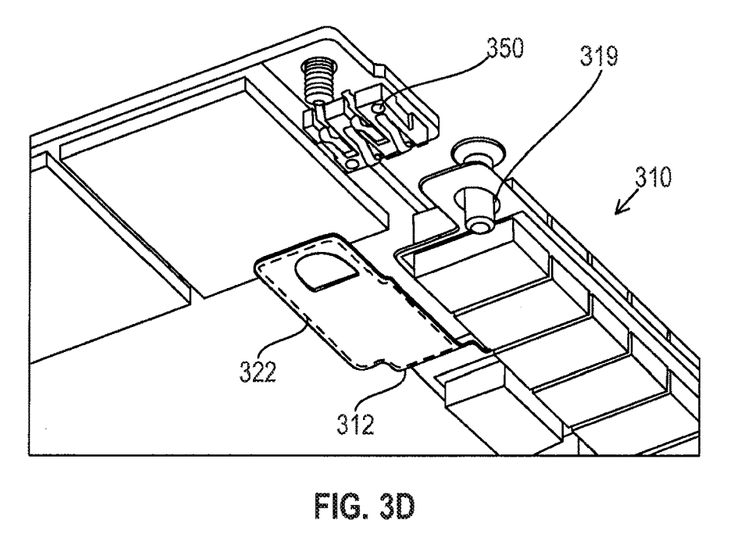
FIG. 3D depicts a close up view of connectors for the component mount of FIG. 3A according to one implementation of the present disclosure.
Figure 3E:
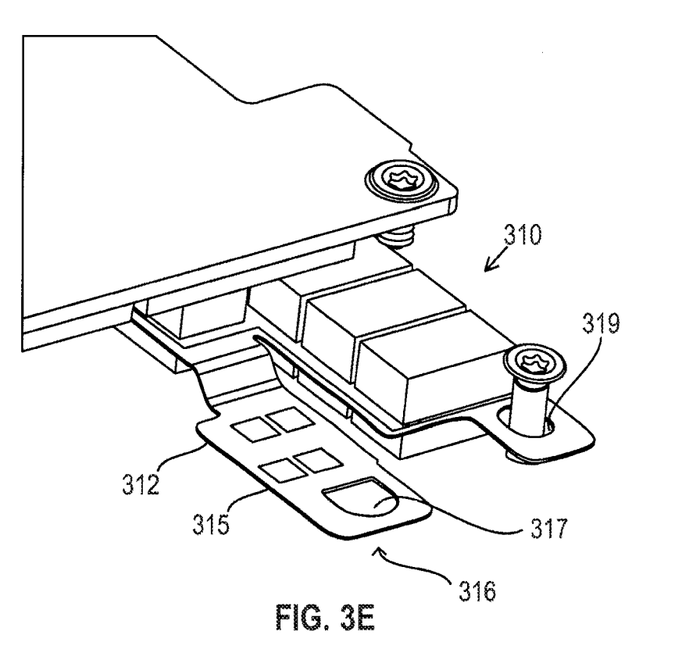
FIG. 3E depicts an alternate view of the connectors shown in FIG. 3D.

FIG. 3B illustrates an "inline" implementation of the component mount 310. An extension portion 316, having the pads 315, extends straight out from a main portion of the component mount 310 and "inline" with the capacitors 320. A capacitor 320 is oriented perpendicular to the other capacitors 320, forming a protrusion 318 corresponding to the notch 308. The protruding capacitor 320 allows for room for the extension portion 316 to align with connectors on the PCB 305. In FIGS. 3D and 3E, the pads 315 contact compression connectors 350. The compression connectors 350 may be used for ground, power, or other electrical connections. An adhesive 322 may be on the underside of at least a portion of the component mount 310. In FIG. 3D, the adhesive 322 covers the entire underside of the extension portion 316. The adhesive 322 may be a double sided pressure sensitive adhesive, which provides adhesion when the component mount 310 is pressed against a base or other component under the component mount 310. In other implementations, the adhesive 322 may be any other appropriate adhesive, such as glue. Moreover, the adhesive 322 may cover other portions of the component mount 310.

Figure 9A:
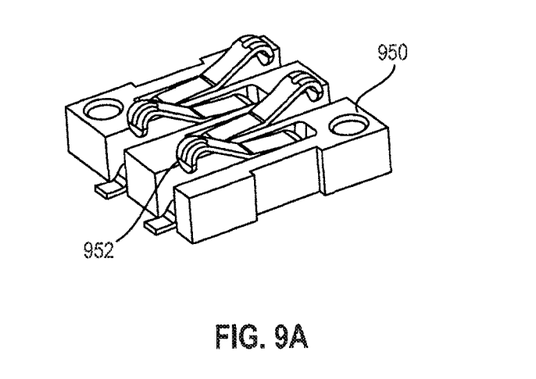
FIG. 9A depicts compression connectors according to one implementation of the present disclosure.
Figure 9B:
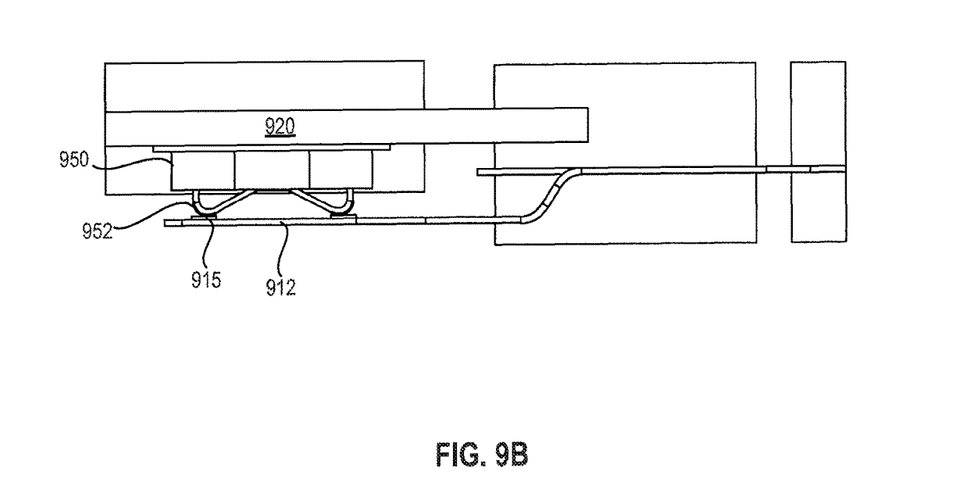
FIG. 9B depicts the compression connector of FIG. 9A coupled to a component mount according to one implementation of the present disclosure.
Figure 9C:
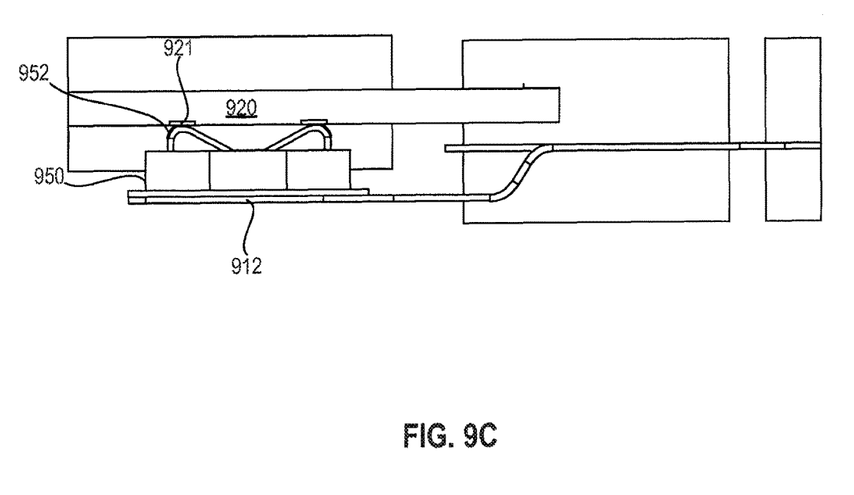
FIG. 9C depicts the compression connector of FIG. 9A disposed on a component mount according to another implementation of the present disclosure.

FIGS. 9A-9C further illustrate compression connectors 950. Each compression connector 950 has a contact 952, which may be a conductive cantilever. In FIG. 9B, the compression connector 950 is mounted on a PCB 920. A component mount 912 aligns with the compression connector 950 such that the contact 952 touches the pads 915. Pressure against the component mount 912 compresses the contact 952 to ensure a stable connection that will not be dislodged from vibration or other mechanical stresses. Alternatively, in FIG. 9C, the compression connector 950 may be placed on the component mount 912, to connect to pads 921 on the PCB 920. This allows for a more controlled device assembly process.

Turning to FIGS. 4A-4D, an SSD 400 includes another implementation of a component mount 410. A PCB 405 occupies a first area 402 and the component mount 410 occupies a second area 403, which allows independent z-heights of the PCB 405 and the component mount 410. The PCB 405 includes a notch 408, which may be smaller than the notch 308, providing more space on the PCB 405. The component mount 410 has a plurality of capacitors 420 mounted on a main portion 412. The main portion 412 may be a flex or a PCB, and has holes 419, pads 415 on an extension portion 416, and an alignment feature 417, similar to the component mount 310. However, the main portion 412 has a "side wing" configuration rather than an "inline" configuration.

Figure 4A:
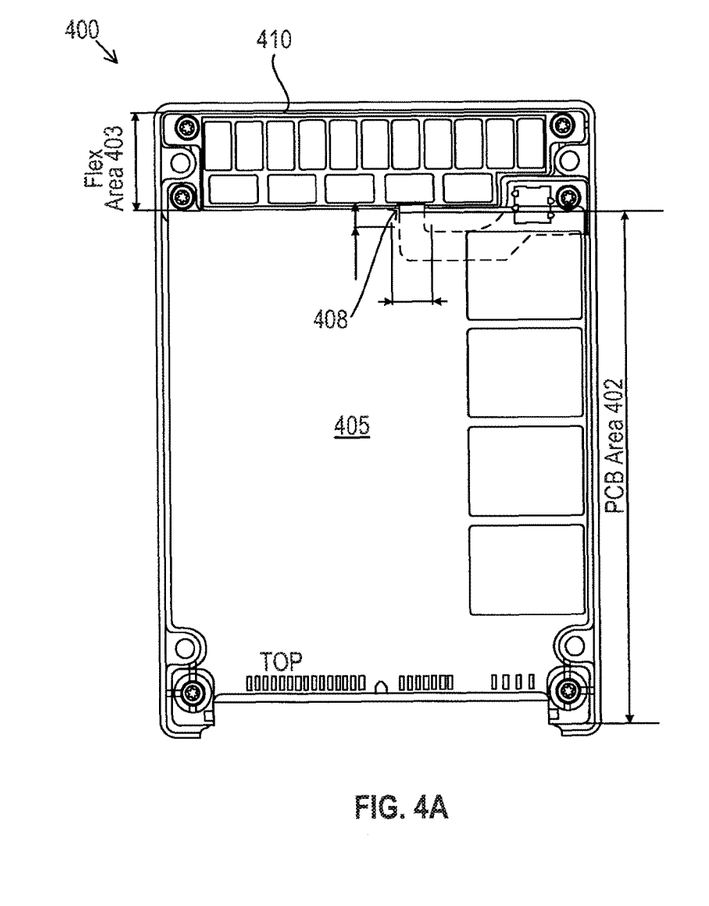
FIG. 4A depicts a component mount layout according to one implementation of the present disclosure.
Figure 4B:
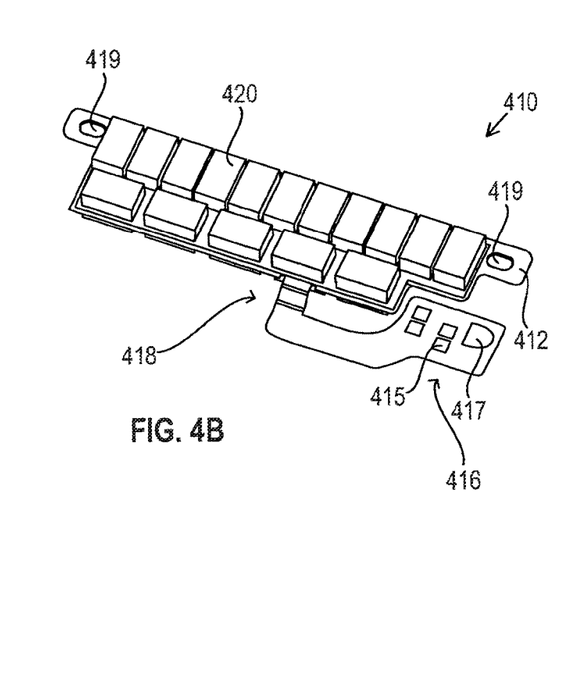
FIG. 4B depicts the component mount of FIG. 4A.

As seen in FIG. 4B, the main portion 412 first extends laterally from the length of the main portion 412 at a protrusion 418. The protrusion 418 may have one or more bends such that the main portion 412 is folded around or under the notch 408 in the PCB 405. The main portion 412 then extends parallel to the length, ending in the extension portion 416 having the pads 415 and the alignment feature 417. The extension portion 416 may be tucked under the PCB 405, with clearance between the protrusion 418 and the PCB 405 to prevent contact, such as rubbing. Contact between the PCB 405 and the protrusion 418 may damage either, for example by damaging traces or other connections.

Figure 4C:
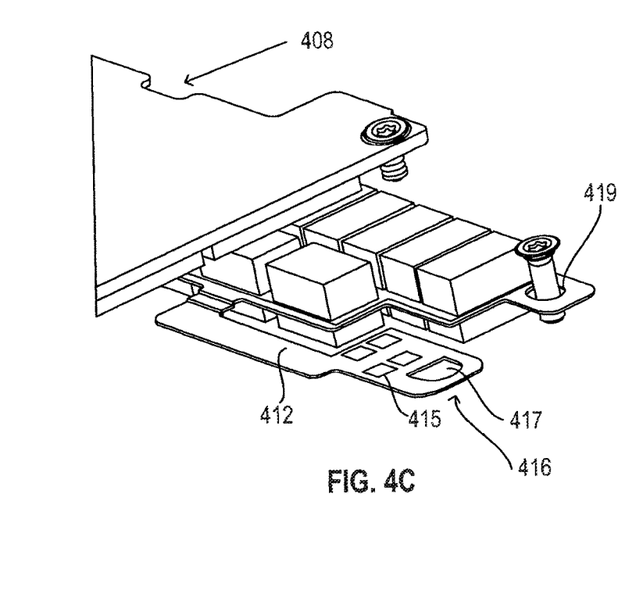
FIG. 4C depicts a close up view of connectors for the component mount of FIG. 4A.
Figure 4D:
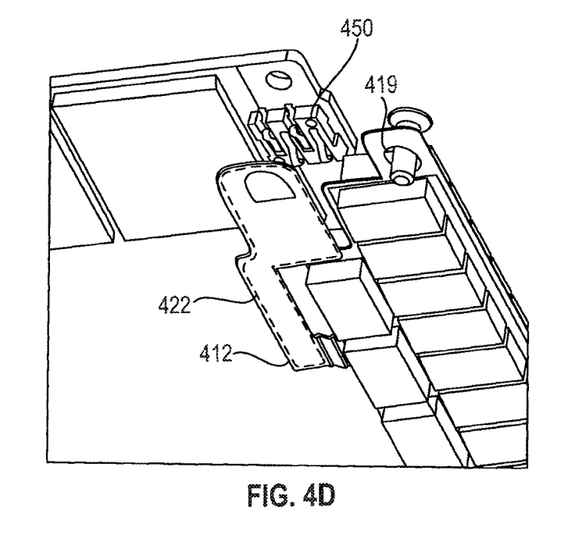
FIG. 4D depicts an alternate view of the connectors shown in FIG. 4C.
Figure 4E:
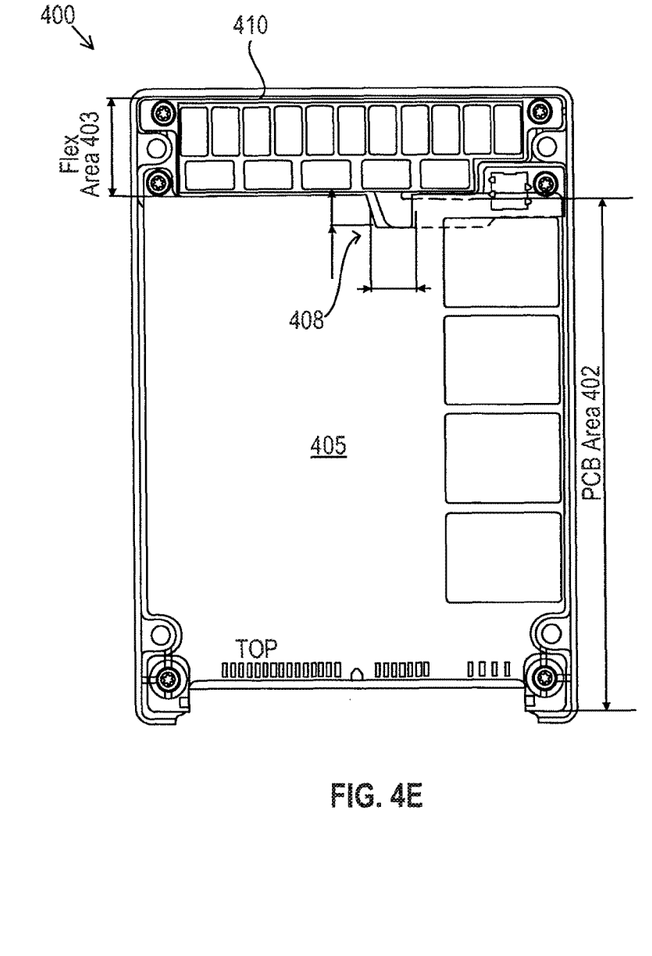
FIG. 4E depicts the component mount layout of FIG. 4A according to another implementation of the present disclosure.
Figure 4F:
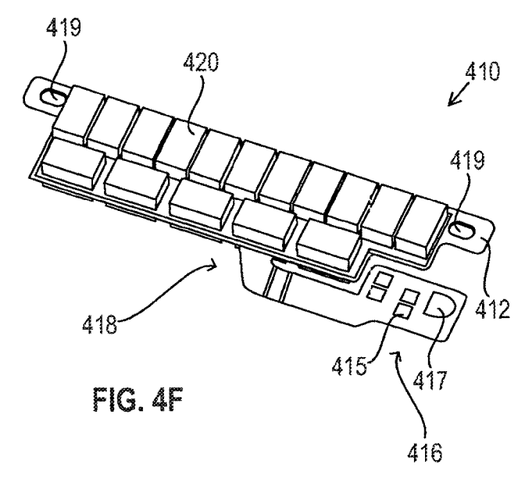
FIG. 4F depicts the component mount of FIG. 4E.
Figure 4G:
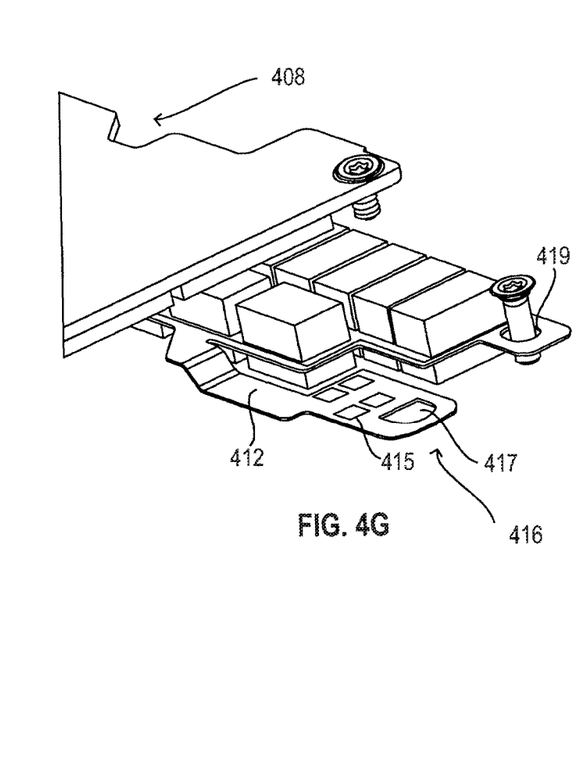
FIG. 4G depicts a close up view of connectors for the component mount of FIG. 4E.
Figure 4H:
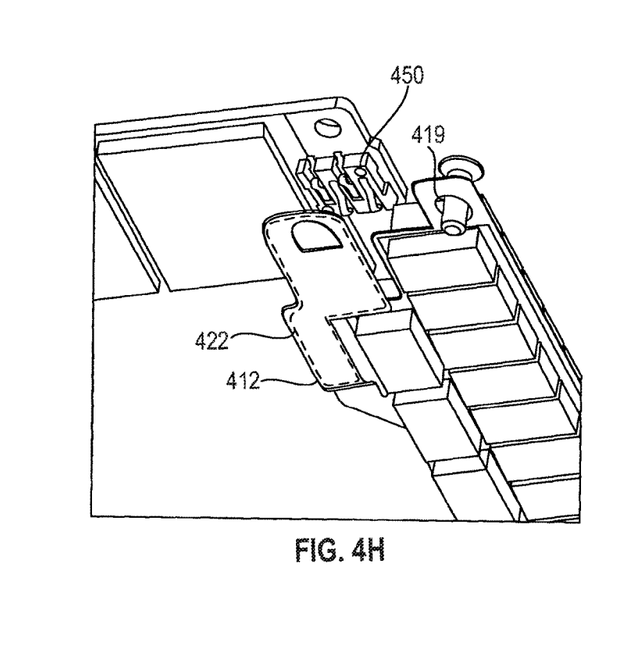
FIG. 4H depicts an alternate view of the connectors shown in FIG. 4G.

As seen in FIGS. 4C and 4D, the pads 415 are arranged to contact compression connectors 450. The side wing design may provide more options for connections and trace layouts as specific components can be separately connected from the other components by shifting the side wing closer to the specific components. The side wing may also provide structural support. In addition, the side wing provides flexibility in arranging components with respect to the PCB 405 and the notch 408. By having a larger extension portion 416, more space on the main portion 412 may be available for mounting components. FIG. 4D further shows an adhesive 422, which may be a pressure sensitive adhesive.

FIGS. 4E-4H depict a variation on the component mount 410. Compared to FIGS. 4A-4D, in FIGS. 4E-4H, the protrusion 418 has a different shape, slanting out along the length of the main portion 412 and having bends before ending at the extension portion 416. The notch 408 accordingly has a similarly slanting shape to accommodate the protrusion 418. In other implementations the protrusion 418 may take other shapes as needed, and may correspond to the notch 408 having a different shape to maximize board space on the PCB 405.

Figure 5A:
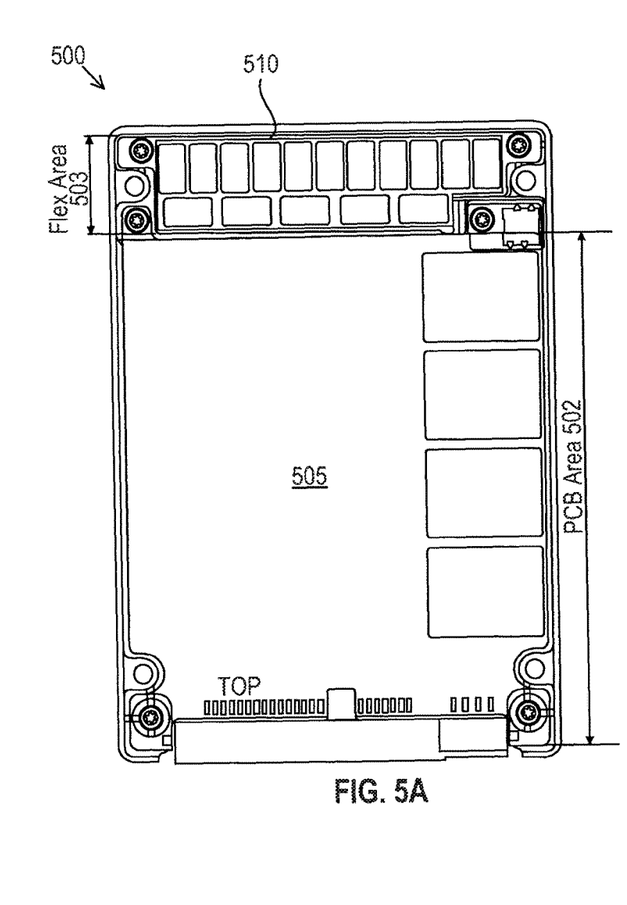
FIG. 5A depicts a component mount layout according to one implementation of the present disclosure.
Figure 5B:
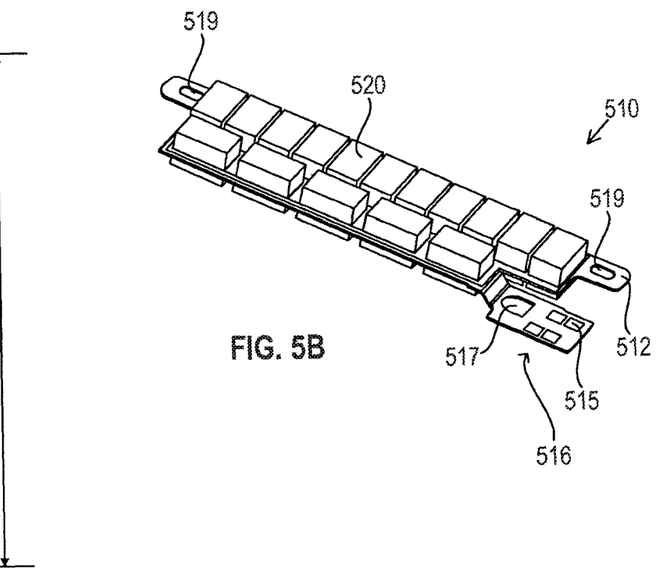
FIG. 5B depicts the component mount of FIG. 5A.

FIG. 5A illustrates an SSD 500 having a component mount 510 according to another implementation. A PCB 505 occupies a first portion 502 and the component mount 510 occupies a second portion 503, allowing the PCB 505 and the component mount 510 to have independent z-heights. In FIG. 5B, the component mount 510 comprises a plurality of capacitors 520 mounted on a main portion 512. The main portion 512 further includes holes 519 and extends to an extension portion 516 having an alignment feature 517 near pads 515. FIG. 5B illustrates a "compact" design. Because there is no protrusions in the component mount 510, the PCB 505 does not need a corresponding notch, which frees more space on the PCB 505. The extension portion 516 holding the pads 515 has a smaller footprint. In addition, the alignment feature 517 is closer to the capacitors 520 than in the inline or side wing designs.

Figure 6:
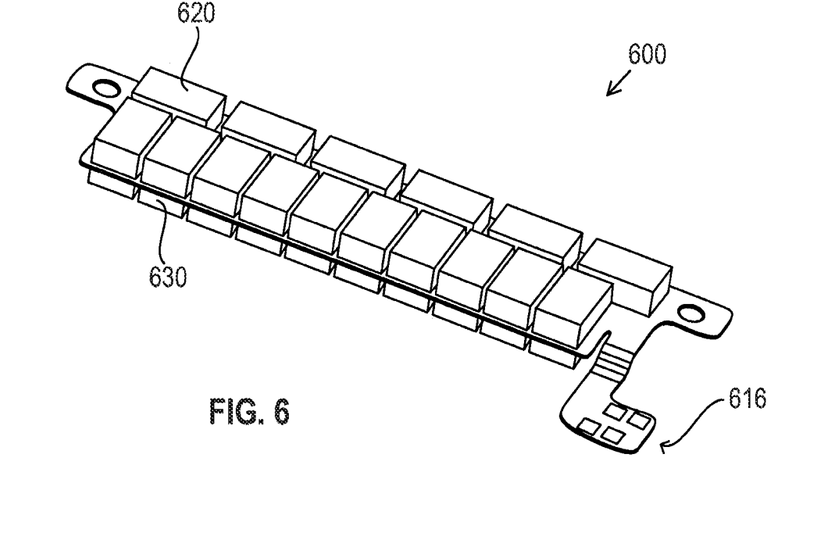
FIG. 6 depicts a component mount according to one implementation of the present disclosure.

FIG. 6 presents yet another implementation of a component mount 600. Unlike the component mounts 310, 410, and 510, the component mount 600 has a plurality of capacitors 620 mounted on a top side and longitudinally arranged near the holes in the flex, and capacitors 620 perpendicular to the longitudinally arranged capacitors 620. The component mount 600 also includes a plurality of capacitors 630 mounted on a bottom side. An extension portion 616 extends perpendicular to a main portion of the component mount 600. This configuration, in which the extension portion 616 lacks a true alignment feature, may allow for more densely packed capacitors 620.

Figure 7A:
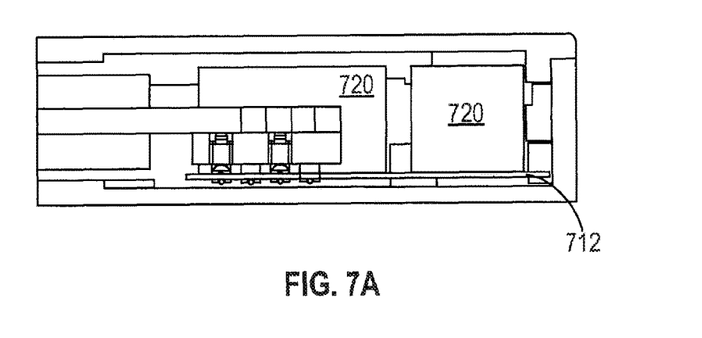
FIG. 7A depicts a component mount in an SSD case according to one implementation of the present disclosure.
Figure 7B:
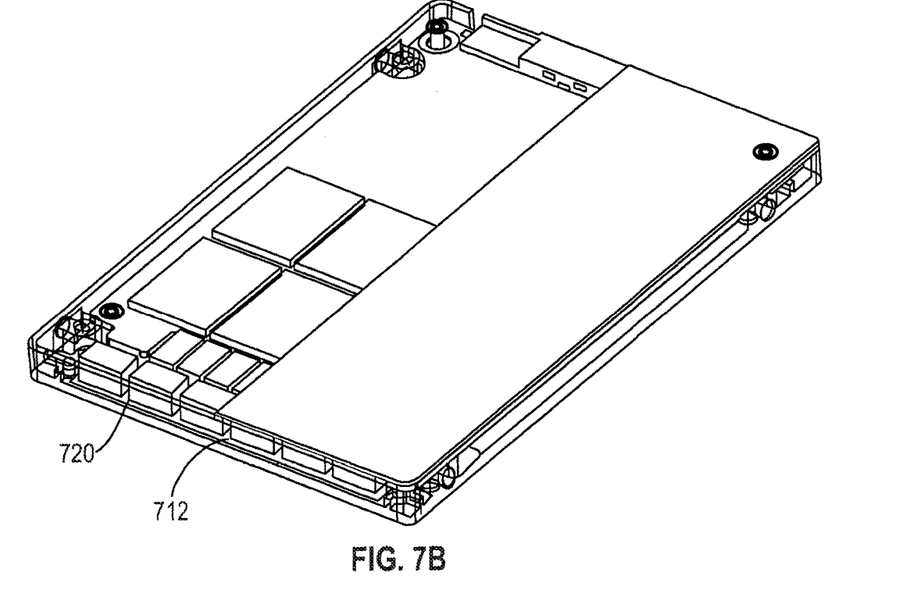
FIG. 7B depicts an alternate view of the SSD case of FIG. 7A.

To mount even taller components, components may be mounted on only one side of the component mount, which may be a flex or PCBA. FIGS. 7A and 7B depict capacitors 720 having a z-height of about 4-5 mm mounted on one side of a PCB 712. The PCB may be thin, having a thickness of around 0.2 mm. The PCB 712 may also provide mechanical stability for the capacitors 720, in particular because of the taller z-heights of the capacitors 720.

The additional z-height available through the use of a component mount can be utilized in various other ways. For example, rather than a thin flex, a thicker PCBA may be used. Components can be mounted on only one side of the flex or PCBA or mounted on both sides, allowing for two levels of components. Additional levels may be added to meet the requirements of the SSD.

Figures 8A, 8B, 8C:
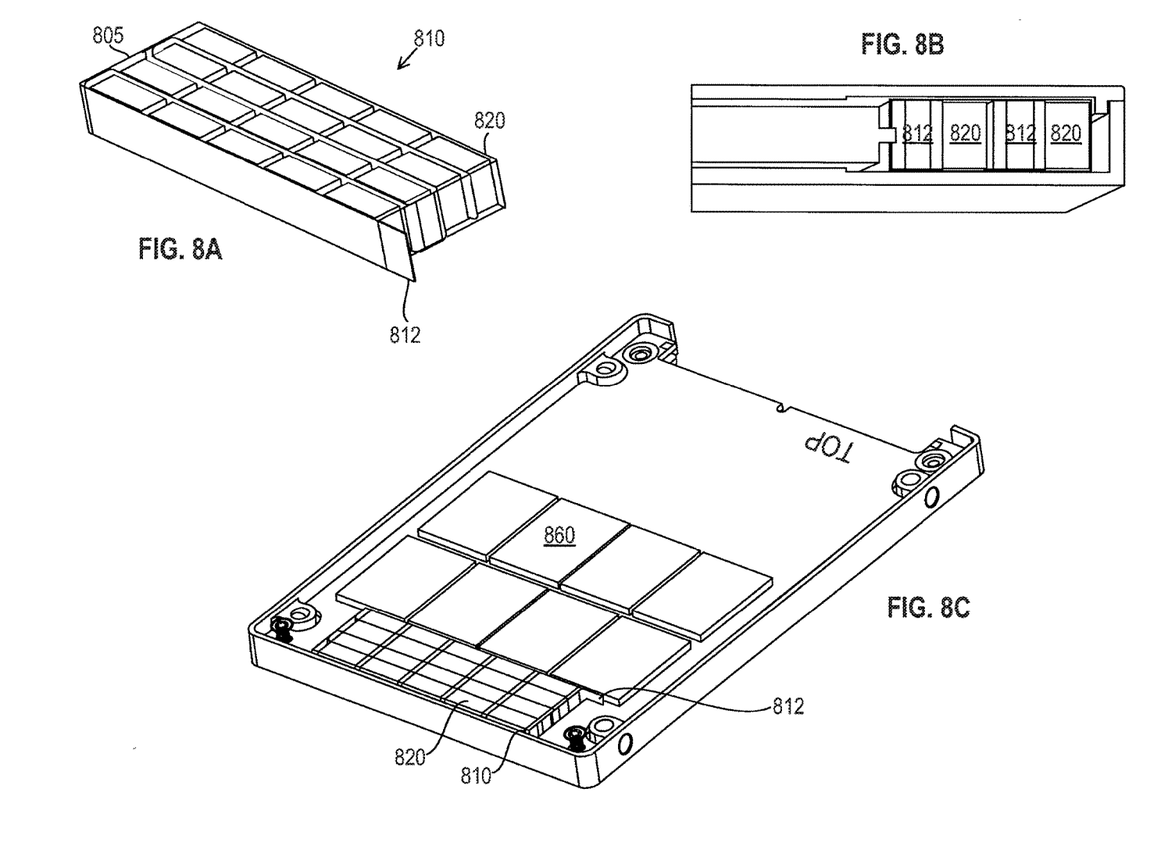
FIG. 8A depicts a component mount according to one implementation of the present disclosure.
FIG. 8B depicts a side view of the component mount of FIG. 8A within an SSD case according to one implementation of the present disclosure.
FIG. 8C depicts an alternate view of the SSD case of FIG. 8B.

FIG. 8A illustrates another implementation of a component mount 810. The component mount 810 comprises a plurality of capacitors 820 arranged in a "snake" or serpentine fashion on a flex 812. The capacitors 820 may be mounted on either side of the flex 812, and disposed horizontally. An optional protective wrap 805 may envelope the component mount 810 to provided additional protection as well as help maintain the serpentine shape of the flex 812.

FIG. 8B illustrates the alternating pattern of the flex 812 and capacitor 820 in a serpentine arrangement from a side view. FIG. 8C depicts the component mount 810 mounted in an SSD, next to flash memory 860. The component mount 810 forms a block which can fit into a corresponding cavity in the SSD, as seen in FIG. 8C. In addition, because the capacitors 820 may be disposed on their sides, the serpentine arrangement of the component mount 810 may provide a compact arrangement of similarly sized rectangular components to achieve higher energy density.

The foregoing description of the disclosed example implementations is provided to enable any person of ordinary skill in the art to make or use the implementations in the present disclosure. Various modifications to these examples will be readily apparent to those of ordinary skill in the art, and the principles disclosed herein may be applied to other examples without departing from the spirit or scope of the present disclosure. The described implementations are to be considered in all respects only as illustrative and not restrictive and the scope of the disclosure is, therefore, indicated by the following claims rather than by the foregoing description. All changes which come within the meaning and range of equivalency of the claims are to be embraced within their scope.

What is claimed is:

1. A component mount for a data storage device (DSD) comprising:
   a printed circuit board assembly (PCBA) having a top side and a bottom side and including a pad for electrically connecting to a printed circuit board (PCB) of the DSD, wherein the PCBA further includes a main portion and an extension portion extending from the main portion, the pad disposed on the extension portion;
   a capacitor disposed on the top side of the PCBA and electrically connected with the pad; and
   a protrusion extending laterally or longitudinally from the main portion and further extending longitudinally along the main portion to connect to the extension portion, wherein the extension portion terminates adjacent or beside the main portion such that the pad is located adjacent the capacitor.

2. The component mount of claim 1, wherein the extension portion extends laterally from the main portion.

3. The component mount of claim 2, wherein the pad is located adjacent a length of the main portion such that the pad is adjacent the capacitor.

4. The component mount of claim 2, wherein the extension portion includes a first portion and a second portion located farther from the main portion than the first portion along a length or a width of the main portion, and wherein the pad is located on the second portion.

5. The component mount of claim 1, wherein the main portion includes a hole for securing the component mount.

6. The component mount of claim 1, wherein the extension portion includes a hole for alignment of the component mount.

7. The component mount of claim 1, further comprising a second capacitor disposed on the bottom side of the PCBA.

8. The component mount of claim 1, further comprising a compression connector on the PCBA.

9. The component mount of claim 1, further comprising a pressure sensitive adhesive on the bottom side of the PCBA.

10. A component mount for a data storage device (DSD) comprising:
    a printed circuit board assembly (PCBA) having a top side and a bottom side and including a pad for electrically connecting to a printed circuit board (PCB) of the DSD, wherein the PCBA further includes a main portion and an extension portion extending from the main portion, the pad disposed on the extension portion; and
    a capacitor disposed on the top side of the PCBA and electrically connected with the pad, wherein the extension portion includes a hole for alignment of the component mount, and wherein the hole includes a non-circular portion.

11. A data storage device (DSD) comprising:
    a base casting defining an area having a first portion and a second portion;
    a printed circuit board (PCB) disposed within the base casting and occupying the first portion of the area, wherein the PCB includes a notch; and
    a component mount disposed within the base casting, occupying the second portion of the area, the component mount comprising:
        a main portion comprising a printed circuit board assembly;
        an extension portion connected to the main portion and including a pad for electrically connecting to the PCB, wherein the extension portion is disposed under the PCB; and
        a capacitor disposed on the main portion and electrically connected with the pad.

12. The DSD of claim 11, wherein a clearance is disposed between the extension portion and the PCB.

13. The DSD of claim 11, wherein the component mount further comprises a protrusion extending laterally or longitudinally from the main portion and further extending longitudinally along the main portion to connect to the extension portion.

14. The DSD of claim 13, wherein the protrusion comprises one or more bends.

15. The DSD of claim 14, wherein the one or more bends of the protrusion fold a portion of the main portion under the notch.

16. The DSD of claim 11, wherein the main portion includes a hole for securing the component mount.

17. The DSD of claim 11, wherein the extension portion includes a hole for alignment of the component mount.

18. The DSD of claim 17, wherein the hole includes a non-circular portion.

* * * * *